United States Patent
Chao et al.

(10) Patent No.: US 11,960,899 B2
(45) Date of Patent: Apr. 16, 2024

(54) DUAL IN-LINE MEMORY MODULE MAP-OUT IN AN INFORMATION HANDLING SYSTEM

(71) Applicant: Dell Products L.P., Round Rock, TX (US)

(72) Inventors: Ching-Lung Chao, Austin, TX (US); Hsin-Chieh Wang, Taoyuan (TW); Wei G. Liu, Austin, TX (US); Yu-Hsuan Chou, Taipei (TW)

(73) Assignee: Dell Products L.P., Round Rock, TX (US)

( * ) Notice: Subject to any disclaimer, the term of this patent is extended or adjusted under 35 U.S.C. 154(b) by 89 days.

(21) Appl. No.: 17/869,844

(22) Filed: Jul. 21, 2022

(65) Prior Publication Data

US 2024/0028342 A1 Jan. 25, 2024

(51) Int. Cl.
*G06F 9/4401* (2018.01)
*G06F 13/16* (2006.01)

(52) U.S. Cl.
CPC .......... *G06F 9/4401* (2013.01); *G06F 13/16* (2013.01); *G06F 2213/16* (2013.01)

(58) Field of Classification Search
CPC ..... G06F 9/4401; G06F 13/16; G06F 2213/16
See application file for complete search history.

(56) References Cited

U.S. PATENT DOCUMENTS

| 10,579,517 B2 | 3/2020 | Berke et al. |
| 10,685,736 B2 | 6/2020 | Berke et al. |
| 2018/0203629 A1* | 7/2018 | Poornachandran ..... G06F 21/76 |

OTHER PUBLICATIONS

Wikipedia Article, "Memory Reference Code", Jun. 2021, retrieved from https://en.wikipedia.org/w/index.php?title=Memory_Reference_Code&oldid=1030556038 on Dec. 4, 2023, pp. 1-2 (Year: 2021).*

* cited by examiner

*Primary Examiner* — Yair Leibovich
*Assistant Examiner* — Indranil Chowdhury
(74) *Attorney, Agent, or Firm* — Larson Newman, LLP

(57) ABSTRACT

An information handling system includes multiple dual in-line memory modules (DIMMs) and a basic input/output system (BIOS). The DIMMs form a memory system of the information handling system. The BIOS begins a system boot of the information handling system, and performs a first memory reference code training. Based on the first memory reference code training, the BIOS discovers a bad DIMM of the DIMMs, and stores information associated with the bad DIMM. The BIOS reboots the information handling system. During the reboot, the BIOS retrieves the information associated with the bad DIMM. The BIOS disables a slot associated with the bad DIMM. In response to the slot being disabled, the BIOS performs a second memory reference code training. Based on the second memory reference code training, the BIOS downgrades the memory system to a closest possible DIMM population.

20 Claims, 4 Drawing Sheets

FIG. 2

| DDR5 | iMC 124 | | | | iMC 122 | | | | iMC 120 | | | | iMC 126 | | | |
|---|---|---|---|---|---|---|---|---|---|---|---|---|---|---|---|---|
| | Channel 154 | | Channel 164 | | Channel 152 | | Channel 162 | | Channel 150 | | Channel 160 | | Channel 156 | | Channel 166 | |
| | DIMM 232 | DIMM 216 | DIMM 220 | DIMM 204 | DIMM 228 | DIMM 212 | DIMM 224 | DIMM 208 | DIMM 218 | DIMM 202 | DIMM 230 | DIMM 214 | DIMM 226 | DIMM 210 | DIMM 222 | DIMM 206 |
| 1 | | | | | | | | | | DDR5 | | | | | | |
| 2 | | | DDR5 | | | | | | | DDR5 | | | | | | |
| 4 | | | DDR5 | | | | DDR5 | | | DDR5 | | | | DDR5 | | |
| 8 | | | DDR5 | | | | DDR5 | | DDR5 | DDR5 | | DDR5 | | DDR5 | | DDR5 |
| 12 | | | DDR5 | DDR5 | | DDR5 | DDR5 | DDR5 | DDR5 | DDR5 | DDR5 | DDR5 | DDR5 | DDR5 | | DDR5 |
| 16 | DDR5 | DDR5 | DDR5 | DDR5 | DDR5 | DDR5 | DDR5 | DDR5 | DDR5 | DDR5 | DDR5 | DDR5 | DDR5 | DDR5 | DDR5 | DDR5 |

MCP 102

200

US 11,960,899 B2

DUAL IN-LINE MEMORY MODULE MAP-OUT IN AN INFORMATION HANDLING SYSTEM

FIELD OF THE DISCLOSURE

This disclosure generally relates to information handling systems, and more particularly relates to dual in-line memory module map-out in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system includes multiple dual in-line memory modules (DIMMs) and a basic input/output system (BIOS). The DIMMs may form a memory system of the information handling system. The BIOS may begin a system boot of the information handling system, and perform a first memory reference code training. Based on the first memory reference code training, the BIOS may discover a bad DIMM of the DIMMs, and store information associated with the bad DIMM. The BIOS may reboot the information handling system. During the reboot, the BIOS may retrieve the information associated with the bad DIMM. The BIOS may disable a slot associated with the bad DIMM. In response to the slot being disabled, the BIOS may perform a second memory reference code training. Based on the second memory reference code training, the BIOS may downgrade the memory system to a closest possible DIMM population.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIG. 2 illustrates a population of dual in-line memory modules for a central processing unit according to an embodiment of the present disclosure;

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
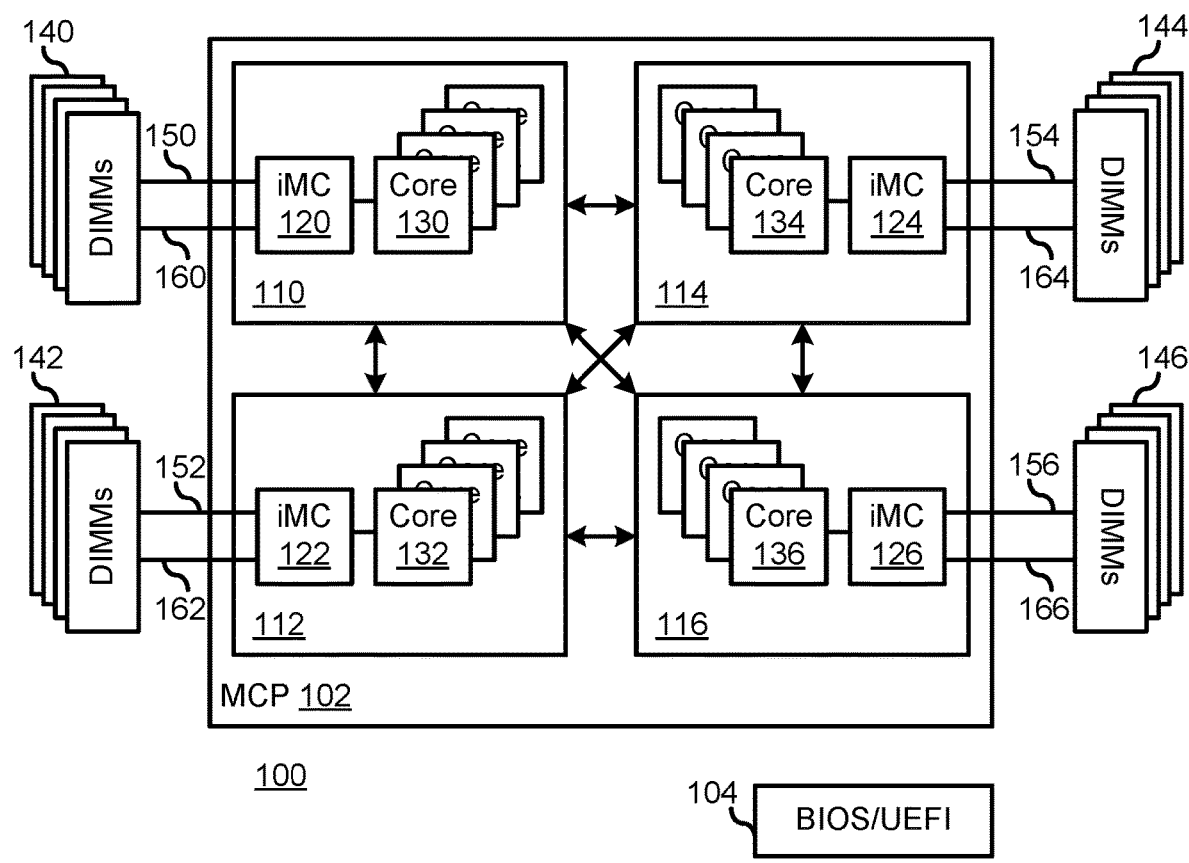
FIG. 1 illustrates a multiple processor core configuration according to an embodiment of the present disclosure.

FIG. 1 illustrates an information handling system 100 according to an embodiment of the present disclosure. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 400 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 400 can include processing resources for executing machine-executable code, such as a central processing unit (CPU), a programmable logic array (PLA), an embedded device such as a System-on-a-Chip (SoC), or other control logic hardware. Information handling system 400 can also include one or more computer-readable medium for storing machine-executable code, such as software or data. Additional components of information handling system 400 can include one or more storage devices that can store machine-executable code, one or more communications ports for communicating with external devices, and various input and output (I/O) devices, such as a keyboard, a mouse, and a video display. Information handling system 400 can also include one or more buses operable to transmit information between the various hardware components.

The architecture of information handling system 100 includes a multi-chip processor (MCP) 102, and a system basic input/output system (BIOS)/universal extensible firmware interface (UEFI) 104. MCP 102 includes four processor die 110, 112, 114, and 116 that are connected together via point-to-point data links, such that processor die 110 is connected to processor die 112 via a first point-to-point data link, to processor die 114 via a second point-to-point data link, and to processor die 116 via a third point-to-point data link. Similarly, processor die 112 is connected to processor die 114 via a fourth point-to-point data link and to processor die 116 via a fifth point-to-point data link, and finally, processor die 114 is connected to processor die 116 via a sixth point-to-point data link. An example of the point-to-point data links include a coherent fabric between processor dies 110, 112, 114, and 116, such as a global memory interconnect (GMI) fabric.

In certain examples, processor dies 110 and 112 may be located in one domain of MCP 102, and processor dies 114 and 116 may be assigned to another domain of the MCP. Additionally, each of processor dies 110, 112, 114, and 116 may be assigned as a different quadrant of MCP 102. For example processor die 110 may be assigned as quadrant 4 of MCP 102, processor die 112 may be assigned as quadrant 1 of the MCP, processor die 114 may be assigned as quadrant 3 of the MCP, and processor die 116 may be assigned as quadrant 4 of the MCP. In certain examples, MCP 102 may be one socket of a dual-socket chip for information handling system 100. Operations to enable and disable different cores in the second socket may be substantially similar to those described herein for MCP 102.

Each of processor die 110, 112, 114, and 116 any suitable number of processor cores, and an integrated memory controller. For example, each processor die may include, but are not limited to, eight processor dies, twelve processor dies, and sixteen processor dies. Processor die 110 includes an integrated memory controller 120 and multiple processor cores 130. Integrated memory controller 120 may be in communication with multiple dual in-line memory modules (DIMMs) 140 via memory channels 150 and 160. Processor die 112 includes an integrated memory controller 122 and multiple processor cores 132. Integrated memory controller 122 may be in communication with multiple DIMMs 142 via communication channels 152 and 162. Processor die 114 includes an integrated memory controller 124 and multiple processor cores 134. Integrated memory controller 124 may be in communication with multiple DIMMs 144 via communication channels 154 and 164. Processor die 116 includes an integrated memory controller 126 and multiple processor cores 136. Integrated memory controller 126 may be in communication with multiple DIMMs 146 via communication channels 156 and 166. An example of memory channels and associated DIMMs 140, 142, 144, and 146 includes memory devices in accordance with a double data rate (DDR) DIMM standard, such as a DDR-4 standard, a DDR-5 standard, or another DDR standard.

Information handling system 100 may include a memory plan of record (POR), which used herein refers to one or more predetermined supported memory configuration for DIMMs 140, 142, 144, and 146. During a system boot, BIOS 104 perform one or more operations associated with a memory POR configuration. For example, BIOS 104 may evaluate DIMM module populations against a POR table. In an example, the POR table may contain the all-supported memory population. Based on a memory population POR setup option, a BIOS in a previous information handling system may allow either all possible memory populations or allow the memory populations listed in the POR table. In this situation, the allowance of all possible memory populations may be referred to as disabling a memory POR enforcement. The allowance of the memory populations listed the POR table may be referred to as enforcing support configurations.

In an example, the memory population setup option may be enabled by default. In previous information handling systems, a BIOS may evaluate a memory population and skip mapping any DIMMs that do not align with the populations specified by the POR table. In these previous information handlings systems, the skipping of DIMMs may degrade the non-POR memory population to a closest possible POR population. In an example, there may be several situations where a failed training of DIMM may cause an entire channel to be turned off. In this example, the healthy DIMMs on the same channel may also be set as invalid. Based on the invalidity of an entire channel, mapping of a lot of memory may be skipped due to one or more DIMMs not aligning with a memory POR population. Information handling system 100 may be improved by BIOS 104 mapping-out or disabling a bad DIMM prior to memory reference code (MRC) training being performed during the system boot. In this example, the bad DIMM that is mapped-out or disable may not cause an entire DIMM channel to be disabled, such that information handling system 100 may have access to more DIMMs.

FIG. 2 illustrates a population schematic 200 of DIMMS for a MCP 102 according to an embodiment of the present disclosure. As stated above with respect to FIG. 1, MCP 102 includes four processor dies and each die includes an integrated memory controller. Thus, MCP 102 includes integrated memory controllers 120, 122, 124, and 126. In the example of FIG. 2, each of integrated memory controllers 120, 122, 124, and 126 may communicate with four DIMMs, and be coupled to two of the four DIMMs via a first memory channel and coupled to the other two DIMMs via a second memory channel.

In an example, integrated memory controller 120 may communicate with DIMMs 202 and 218 via memory channel 150, and with DIMMs 214 and 230 via memory channel 160. Integrated memory controller 122 may communicate with DIMMs 212 and 228 via memory channel 152, and with DIMMs 208 and 224 via memory channel 162. Integrated memory controller 124 may communicate with DIMMs 216 and 232 via memory channel 154, and with DIMMs 204 and 220 via memory channel 164. Integrated memory controller 126 may communicate with DIMMs 210 and 226 via memory channel 156, and with DIMMs 206 and 222 via memory channel 166.

In certain examples, different DIMMs may be connected to MCP 102 via the integrated memory controllers 120, 122, 124, and 126. As DIMM memories are populated within an information handling system including MCP 102, different memory configurations may be instantiated. For example, the population of the DIMMs may include a DIMM (1) populated system, a DIMM (2) populated system, a DIMM (4) populated system, a DIMM (8) populated system, a DIMM (12) populated system, and a DIMM (16) populated system. As illustrated in population schematic 200, when a DIMM is connected to MCP 102, a DDR5 label is included in the population schematic under the corresponding DIMM.

In an example, DIMM 202 is the only DIMM coupled to MCP 102 when it is a DIMM (1) populated system. DIMMs 202 and 220 are coupled to MCP 102 when it is a DIMM (2) populated system. In an example, DIMMs 202, 210, 220, and 224 are coupled to MCP 102 when it is a DIMM (4) populated system. DIMMs 202, 206, 210, 214, 220, 224, 228, and 232 are coupled to MCP 102 when it is a DIMM (8) populated system. DIMMs 202, 204, 206, 208, 210, 214, 218, 220, 224, 228, 226, and 232 are coupled to MCP 102 when it is a DIMM (12) populated system. All DIMMs 202-232 are coupled to MCP 102 when it is a DIMM (16) populated system.

In previous information handling systems, if a particular DIMM, such as DIMM 216 is bad, the entire memory channel 154 may be disabled. In these previous information handling systems, the disabling of memory channel 154 may cause DIMMs 216 and 232 to be invalid. In this situation, the memory system would be downgraded to a configuration of a populated system without DIMMs 216 and 232. For example, the memory system would be downgraded from a DIMM (16) populated system to a DIMM (4) populated system. Information handling system 100 may be improved by BIOS 104 disabling the bad DIMM, such as DIMM 216, before memory reference code (MRC) training. This operation by BIOS 104 may prevent the drastic downgrade of the memory system as found in previous information handling systems.

In an example, the memory system for MCP 102 may be configured as a DIMM (16) populated system. While the memory system is configured as a DIMM (16) populated system, a particular DIMM, such as DIMM 216, may become bad. During a next power on event of information handling system 100, BIOS 104 may perform MRC training for DIMMs 202-232 in communication with MCP 102. During the MRC training, BIOS 104 may discover bad DIMM 216 and disable channel 154. In response to the discovery of bad DIMM 216 and disabling channel 154, BIOS 154 may perform any suitable operations to log the bad DIMM. For example, BIOS 104 may log information associated with bad DIMM 216 in a NVRAM(SetNVRAMAttributeValue) of a memory HOB. BIOS 104 may then set a reboot flag, which in turn may cause information handling system to reboot.

During the subsequent boot, BIOS 104 may determine whether data is stored within the NVRAM(SetNVRAMAttributeValue). If so, BIOS 104 may retrieve the information associated with bad DIMM 216, such as an identifier for the bad DIMM. Based on the information associated with bad DIMM 216, BIOS 104 may disable the bad DIMM slot. In an example, disabling the bad DIMM slot may cause bad DIMM 216 to be mapped-out of the memory system. Based on bad DIMM 216 slot being disabled, integrated memory controller 124 may be only connected to DIMM 232 via memory channel 154.

After the slot for bad DIMM 216 being disabled, BIOS 104 may execute the MRC training for the memory system. Based on the MRC training result, BIOS 104 may downgrade the non-POR memory population to a closest possible POR population. For example, the memory system may be degraded from a DIMM (16) populated system to a DIMM (12) populated system. In an example, the closest possible POR population may be the POR population that includes the greatest number of DIMMs without the bad DIMM 216 being in the POR population. In this example, BIOS 104 may map-out bad DIMM 216 to enable the memory system be downgraded to a higher POR populated system as compared to previous information handling systems.

Figure 3:
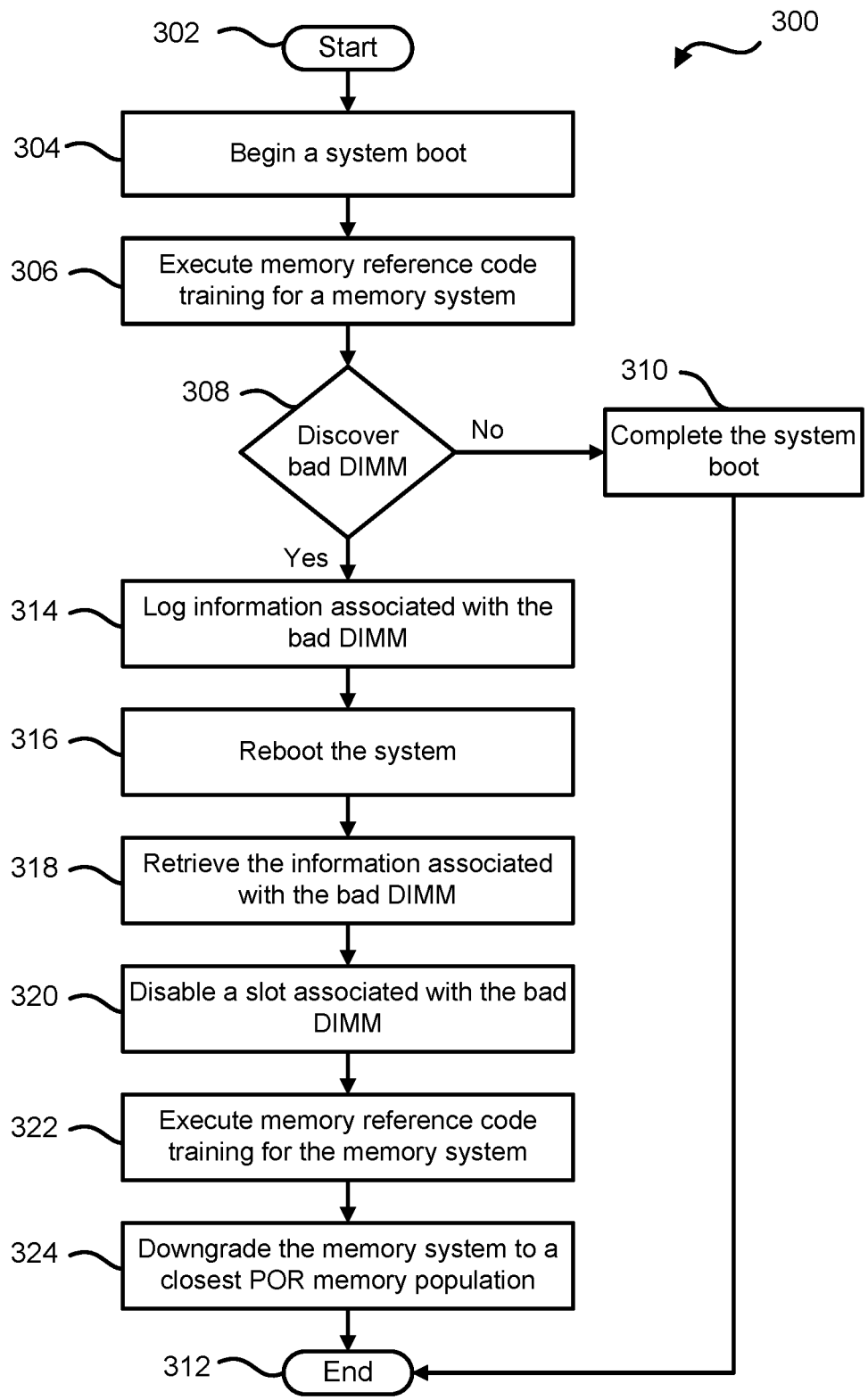
FIG. 3 illustrates a method for mapping out a dual in-line memory module in an information handling system according to an embodiment of the present disclosure.

FIG. 3 illustrates a method 300 for mapping-out a DIMM in an information handling system according to an embodiment of the present disclosure, starting at block 302. In an example, the method 300 may be performed by any suitable component including, but not limited to, BIOS 104 of FIG. 1. It will be readily appreciated that not every method step set forth in this flow diagram is always necessary, and that certain steps of the methods may be combined, performed simultaneously, in a different order, or perhaps omitted, without varying from the scope of the disclosure.

At block 304, a system boot for an information handling system is begun. At block 306, a MRC training is executed for a memory system of the information handling system. In an example, the memory system includes multiple DIMMs in communication with different integrated memory controllers of a MCP in the information handling system. At block 308, a determination is made whether a bad DIMM was discovery during the MRC training. In response to no bad DIMMs being discovered, the system boot is completed at block 310, and the flow ends at block 312.

In response to a bad DIMM being discovered, information associated with the bad DIMM is logged at block 314. In an example, the information may be logged in a memory HOB. For example, the information for the bad DIMM may be logged in a NVRAM(SetNVRAMAttributeValue) of the memory HOB. In certain examples, a reboot flag may be set based on a bad DIMM being discovered. At block 316, the system is rebooted. During a subsequent system boot, the information associated with the bad DIMM is retrieved at block 318.

At block 320, a slot associated with the bad DIMM is disabled. In an example, the slot associated with the bad DIMM may be determined based on the information for the bad DIMM. In certain examples, disabling the slot associated with the bad DIMM may map-out the bad DIMM from the memory system. In response to the slot associated with the bad DIMM, the memory system may be in a non-POR population. At block 322, the MRC training for the memory system is executed. At block 324, the memory system is downgraded to a closest POR memory population, and the flow ends at block 312. In an example, the memory system may be downgraded from the non-POR population to the closest POR memory population.

Figure 4:
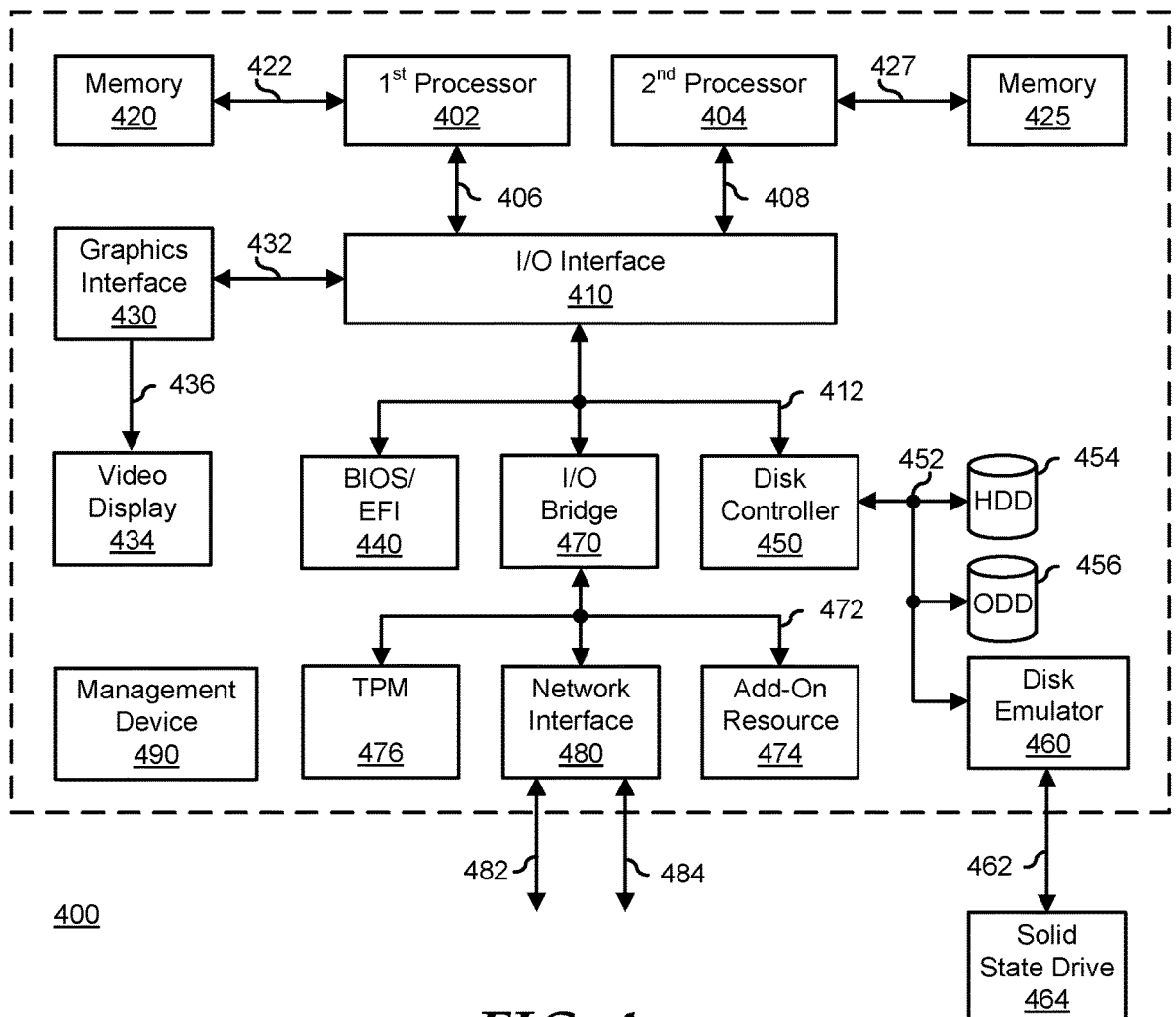
FIG. 4 is a block diagram illustrating a generalized information handling system according to an embodiment of the present disclosure.

FIG. 4 shows a generalized embodiment of an information handling system 400 according to an embodiment of the present disclosure. Information handling system 400 can include devices or modules that embody one or more of the devices or modules described below and operates to perform one or more of the methods described below. Information handling system 400 includes a processors 402 and 404, an input/output (I/O) interface 410, memories 420 and 425, a graphics interface 430, a basic input and output system/universal extensible firmware interface (BIOS/UEFI) module 440, a disk controller 450, a hard disk drive (HDD) 454, an optical disk drive (ODD) 456, a disk emulator 460 connected to an external solid state drive (SSD) 462, an I/O bridge 470, one or more add-on resources 474, a trusted platform module (TPM) 476, a network interface 480, a management device 490, and a power supply 495. Processors 402 and 404, I/O interface 410, memory 420, graphics interface 430, BIOS/UEFI module 440, disk controller 450, HDD 454, ODD 456, disk emulator 460, SSD 462, I/O bridge 470, add-on resources 474, TPM 476, and network interface 480 operate together to provide a host environment of information handling system 400 that operates to provide the data processing functionality of the information handling system. The host environment operates to execute machine-executable code, including platform BIOS/UEFI code, device firmware, operating system code, applications, programs, and the like, to perform the data processing tasks associated with information handling system 400.

In the host environment, processor 402 is connected to I/O interface 410 via processor interface 406, and processor 404 is connected to the I/O interface via processor interface 408. Memory 420 is connected to processor 402 via a memory interface 422. Memory 425 is connected to processor 404 via a memory interface 427. Graphics interface 430 is connected to I/O interface 410 via a graphics interface 432 and provides a video display output 436 to a video display 434. In a particular embodiment, information handling system 400 includes separate memories that are dedicated to each of processors 402 and 404 via separate memory interfaces. An example of memories 420 and 425 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 440, disk controller 450, and I/O bridge 470 are connected to I/O interface 410 via an I/O channel 412. An example of I/O channel 412 includes a Peripheral Component Interconnect (PCI) interface, a PCI-Extended (PCI-X) interface, a high-speed PCI-Express (PCIe) interface, another industry standard or proprietary communication interface, or a combination thereof. I/O interface 410 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 440 includes BIOS/UEFI code operable to detect resources within information handling system 400, to provide drivers for the resources, initialize the resources, and access the resources. BIOS/UEFI module 440 includes code that operates to detect resources within information handling system 400, to provide drivers for the resources, to initialize the resources, and to access the resources.

Disk controller 450 includes a disk interface 452 that connects the disk controller to HDD 454, to ODD 456, and to disk emulator 460. An example of disk interface 452 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 460 permits SSD 464 to be connected to information handling system 400 via an external interface 462. An example of external interface 462 includes a USB interface, an IEEE 3394 (Firewire) interface, a proprietary interface, or a combination thereof. Alternatively, solid-state drive 464 can be disposed within information handling system 400.

I/O bridge 470 includes a peripheral interface 472 that connects the I/O bridge to add-on resource 474, to TPM 476, and to network interface 480. Peripheral interface 472 can be the same type of interface as I/O channel 412 or can be a different type of interface. As such, I/O bridge 470 extends the capacity of I/O channel 412 when peripheral interface 472 and the I/O channel are of the same type, and the I/O bridge translates information from a format suitable to the I/O channel to a format suitable to the peripheral channel 472 when they are of a different type. Add-on resource 474 can include a data storage system, an additional graphics interface, a network interface card (NIC), a sound/video processing card, another add-on resource, or a combination thereof. Add-on resource 474 can be on a main circuit board, on separate circuit board or add-in card disposed within information handling system 400, a device that is external to the information handling system, or a combination thereof.

Network interface 480 represents a NIC disposed within information handling system 400, on a main circuit board of the information handling system, integrated onto another component such as I/O interface 410, in another suitable location, or a combination thereof. Network interface device 480 includes network channels 482 and 484 that provide interfaces to devices that are external to information handling system 400. In a particular embodiment, network channels 482 and 484 are of a different type than peripheral channel 472 and network interface 480 translates information from a format suitable to the peripheral channel to a format suitable to external devices. An example of network channels 482 and 484 includes InfiniBand channels, Fibre Channel channels, Gigabit Ethernet channels, proprietary channel architectures, or a combination thereof. Network channels 482 and 484 can be connected to external network resources (not illustrated). The network resource can include another information handling system, a data storage system, another network, a grid management system, another suitable resource, or a combination thereof.

Management device 490 represents one or more processing devices, such as a dedicated baseboard management controller (BMC) System-on-a-Chip (SoC) device, one or more associated memory devices, one or more network interface devices, a complex programmable logic device (CPLD), and the like, which operate together to provide the management environment for information handling system 400. In particular, management device 490 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 400, such as system cooling fans and power supplies. Management device 490 can include a network connection to an external management system, and the management device can communicate with the management system to report status information for information handling system 400, to receive BIOS/UEFI or system firmware updates, or to perform other task for managing and controlling the operation of information handling system 400.

Management device 490 can operate off of a separate power plane from the components of the host environment so that the management device receives power to manage information handling system 400 when the information handling system is otherwise shut down. An example of management device 490 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 490 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
   a plurality of dual in-line memory modules (DIMMs) forming a memory system of the information handling system; and
   a basic input/output system (BIOS) to communicate with the DIMMs, the BIOS to:
   begin a system boot of the information handling system;
   perform a first memory reference code training;
   based on the first memory reference code training, discover a bad DIMM of the DIMMs;
   store information associated with the bad DIMM;
   reboot the information handling system;
   during the reboot, retrieve the information associated with the bad DIMM;
   disable a slot associated with the bad DIMM;
   in response to the slot being disabled, perform a second memory reference code training; and
   based on the second memory reference code training, downgrade the memory system to a closest possible DIMM population.

2. The information handling system of claim 1, wherein the BIOS further to set a reboot flag, wherein the information handling system is rebooted based on the reboot flag being set.

3. The information handling system of claim 1, further comprising a multiple core processor to communicate with each of the DIMMs.

4. The information handling system of claim 3, further comprising a plurality of memory channels, wherein first and second DIMMs of the DIMMs are configured to communicate with the multiple core processor via a first memory channel of the memory channels.

5. The information handling system of claim 4, wherein the multiple core processor is coupled to only the first DIMM based on the slot associated with the bad DIMM being disabled, wherein the second DIMM is the bad DIMM.

6. The information handling system of claim 1, wherein the memory system includes a memory plan of record (POR) to identify a plurality of POR DIMM population configurations.

7. The information handling system of claim 6, wherein the closest possible DIMM population is a POR DIMM population including a largest number of the DIMMs being populated without the bad DIMM based on the memory POR.

8. The information handling system of claim 1, wherein the disablement of the slot associated with the bad DIMM creates a non memory plan of record (non-POR) population of the DIMMs in the memory system.

9. A method, comprising:
   beginning, by a basic input/output system (BIOS), a system boot of an information handling system;
   performing, by the BIOS, a first memory reference code training;
   based on the first memory reference code training, discovering a bad dual in-line memory module (DIMM) of a plurality of DIMMs;
   storing information associated with the bad DIMM;
   rebooting the information handling system;
   during the reboot, retrieving the information associated with the bad DIMM;
   disabling a slot associated with the bad DIMM;
   in response to the slot being disabled, performing a second memory reference code training; and
   based on the second memory reference code training, downgrading a memory system to a closest possible DIMM population.

10. The method of claim 9, further comprising setting a reboot flag, wherein the information handling system is rebooted based on the reboot flag being set.

11. The method of claim 9, wherein first and second DIMMs of the DIMMs are configured to communicate with a multiple core processor via a first memory channel of a plurality of memory channels.

12. The method of claim 11, wherein the multiple core processor is coupled to only the first DIMM based on the slot associated with the bad DIMM being disabled, wherein the second DIMM is the bad DIMM.

13. The method of claim 9, wherein the memory system includes a memory plan of record (POR) to identify a plurality of POR DIMM population configurations.

14. The method of claim 13, wherein the closest possible DIMM population is a memory plan of record (POR) DIMM population including a largest number of the DIMMs being populated without the bad DIMM based on the memory POR.

15. The method of claim 9, wherein the disabling of the slot associated with the bad DIMM creates a non memory plan of record (non-POR) population of the DIMMs in the memory system.

16. An information handling system, comprising:
   a plurality of dual in-line memory modules (DIMMs) forming a memory system of the information handling system;
   a multiple core processor to communicate with each of the DIMMs;
   a plurality of memory channels, wherein first and second ones of the DIMMs are configured to communicate with the multiple core processor via a first memory channel of the memory channels; and
   a basic input/output system (BIOS) to communicate with the DIMMs, the BIOS to:
   begin a system boot of the information handling system;
   perform a first memory reference code training;
   based on the first memory reference code training, discover a bad DIMM of the DIMMs;
   store information associated with the bad DIMM;
   set a reboot flag;
   based on the reboot flag being set, reboot the information handling system;
   during the reboot, retrieve the information associated with the bad DIMM;
   disable a slot associated with the bad DIMM;
   in response to the slot being disabled, perform a second memory reference code training; and
   based on the second memory reference code training, downgrade the memory system to a closest possible DIMM population.

17. The information handling system of claim 16, wherein the multiple core processor is coupled to only the first DIMM based on the slot associated with the bad DIMM being disabled, wherein the second DIMM is the bad DIMM.

18. The information handling system of claim 16, wherein the memory system includes a memory plan of record (POR) to identify a plurality of POR DIMM population configurations.

19. The information handling system of claim 18, wherein the closest possible DIMM population is a POR DIMM population including a largest number of the DIMMs being populated without the bad DIMM based on the memory POR.

20. The information handling system of claim 16, wherein the disablement of the slot associated with the bad DIMM creates a non memory plan of record (non-POR) population of the DIMMs in the memory system.

\* \* \* \* \*